US009143117B2

(12) United States Patent
Wen et al.

(10) Patent No.: US 9,143,117 B2
(45) Date of Patent: Sep. 22, 2015

(54) SOFT ERROR PROTECTION DEVICE

(71) Applicant: National Chiao Tung University, Hsinchu (TW)

(72) Inventors: Charles Hung-Pin Wen, Zhudong Township, Hsinchu County (TW); Chun-Wei Chang, Taipei (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 32 days.

(21) Appl. No.: 14/046,420

(22) Filed: Oct. 4, 2013

(65) Prior Publication Data

US 2014/0215286 A1 Jul. 31, 2014

(30) Foreign Application Priority Data

Jan. 29, 2013 (TW) .............................. 102103284 A

(51) Int. Cl.
  *H03K 3/37* (2006.01)
  *G11C 7/10* (2006.01)
  *G11C 5/00* (2006.01)
  *H03K 3/037* (2006.01)

(52) U.S. Cl.
  CPC .............. *H03K 3/0375* (2013.01); *G11C 5/005* (2013.01); *G11C 7/106* (2013.01)

(58) Field of Classification Search
  CPC ................ H03K 3/0375; H03K 5/135; H03K 2005/00052; H03K 3/037; G01R 31/31816; G01R 31/318525; G01R 31/3016; G11C 7/106; G11C 5/005
  USPC .......................................... 714/700; 327/202
  See application file for complete search history.

(56) References Cited

U.S. PATENT DOCUMENTS

| 5,455,536 | A  | * | 10/1995 | Kono et al. ..................... 329/325 |
| 6,380,781 | B1 |   | 4/2002  | Karnik et al. |
| 6,476,643 | B2 | * | 11/2002 | Hugues et al. ................... 326/93 |
| 6,573,774 | B1 |   | 6/2003  | Gardner |
| 7,038,515 | B2 |   | 5/2006  | Rusu et al. |
| 7,650,550 | B2 | * | 1/2010  | Ramaswami et al. ......... 714/731 |
| 7,772,915 | B2 | * | 8/2010  | Kim ............................... 327/512 |
| 8,255,748 | B2 | * | 8/2012  | Moyer et al. ................... 714/724 |
| 8,407,540 | B2 | * | 3/2013  | Chandra ........................ 714/726 |

(Continued)

OTHER PUBLICATIONS

Mavis et al., "Soft Error Rate Mitigation Technoques for Modern Microcircuits", IEEE 40$^{th}$ Annual International Reliability Physics Symposium, Dallas, Texas, 2002, pp. 216-225.
Mitra et al., "Combinational Logic Soft Error Correction", International Test Conference, 2006, pp. 1-9.

*Primary Examiner* — James C Kerveros
(74) *Attorney, Agent, or Firm* — Muncy, Geissler, Olds & Lowe, P.C.

(57) ABSTRACT

A soft error protection device includes a soft error resilient latch (SERL) and a latch coupled to a detection device and receiving a soft error pulse and a clock (CLK) signal respectively outputted by an electronic element and a CLK generator. The SERL delays the soft error pulse. In the period of a negative level of the CLK signal, the SERL stores the delayed soft error pulse corresponding to the negative level and used as a first detection data. Meanwhile, the latch stores the soft error pulse as a second detection data. The detection device receives the CLK signal, the first and second detection datum, and compares the first and second detection datum to send out a detection signal when the CLK signal rises from the negative level to a positive level.

8 Claims, 4 Drawing Sheets

(56) References Cited

U.S. PATENT DOCUMENTS 8,499,265 B2 * 7/2013 Potvin .......................... 716/108
8,502,561 B2 * 8/2013 Howard et al. ................. 326/93
8,635,503 B2 * 1/2014 Tang et al. .................... 714/726
2002/0043989 A1 * 4/2002 Hugues et al. ................. 326/93

* cited by examiner

SOFT ERROR PROTECTION DEVICE

BACKGROUND OF THE INVENTION

1. Field of the Invention

The present invention relates to a protection device, particularly to a soft error protection device.

2. Description of the Related Art

Soft error is a transient fault, induced by one particle in cosmic striking the sensitive region of a transistor with deposited charges, latched by a memory element after propagation. In recent years, since the technology keeps scaling down and the parasitic capacitance in the circuit becomes smaller, the circuit is more susceptible to the soft error. Therefore, many advance architectures of the latch were proposed to protect the occurrence of soft error.

The U.S. Pat. No. 6,380,781 used the loading transistor to enlarge the capacitance and eliminate the unexpected pulse. However, the loading transistor may cause an unequal transient and affect the normal operation. Therefore, the U.S. Pat. No. 6,573,774 disclosed two duplications of latches were proposed to vote and select the certain logic value, but such design has area overhead due to the replicated latches. Moreover, C-element was proposed in the U.S. Pat. No. 7,038,515 to protect the soft error and corrects the error value. However, these three techniques can only prevent the soft error in the memory cell but cannot protect the occurrence of soft error in the combination logics. As a result, Build-In Soft Error Resilience (BISER) was proposed in the conventional technology to protect the soft error occurring on both memory and combinational circuit. BISER uses the double latching, delay buffer and C-element to achieve the soft-error protection. However, BISER still has some issues and can be improved. For example, it requires a certain number of transistors, which also increases the probability of soft error and results in more area overhead.

To overcome the abovementioned problems, the present invention provides a soft error protection device, so as to solve the afore-mentioned problems of the prior art.

SUMMARY OF THE INVENTION

A primary objective of the present invention is to provide a soft error protection device, which reduces the probabilities of the occurrence of soft error, the number and area of transistors compared with Build-In Soft Error Resilient (BISER).

To achieve the abovementioned objectives, the present invention provides a soft error protection device, which comprises a soft error resilient latch (SERL) coupled to an electronic element and a clock (CLK) generator and receiving a soft error pulse and a clock (CLK) signal respectively outputted by the electronic element and the CLK generator. The SERL delays the soft error pulse. In the period of a negative level of the CLK signal, the SERL stores the delayed soft error pulse corresponding to the negative level and used as a first detection data. The electronic element and the CLK generator are coupled to a first latch receiving the soft error pulse and the clock signal. In the period of the negative level, the first latch stores the soft error pulse as a second detection data. The SERL, the clock generator and the first latch are coupled to a detection device receiving the CLK signal, the first and second detection datum, and comparing the first and second detection datum to send out a detection signal when the CLK signal rises from the negative level to a positive level.

Below, the embodiments are described in detail in cooperation with the drawings to make easily understood the technical contents, characteristics and accomplishments of the present invention.

DETAILED DESCRIPTION OF THE INVENTION

Figure 1:
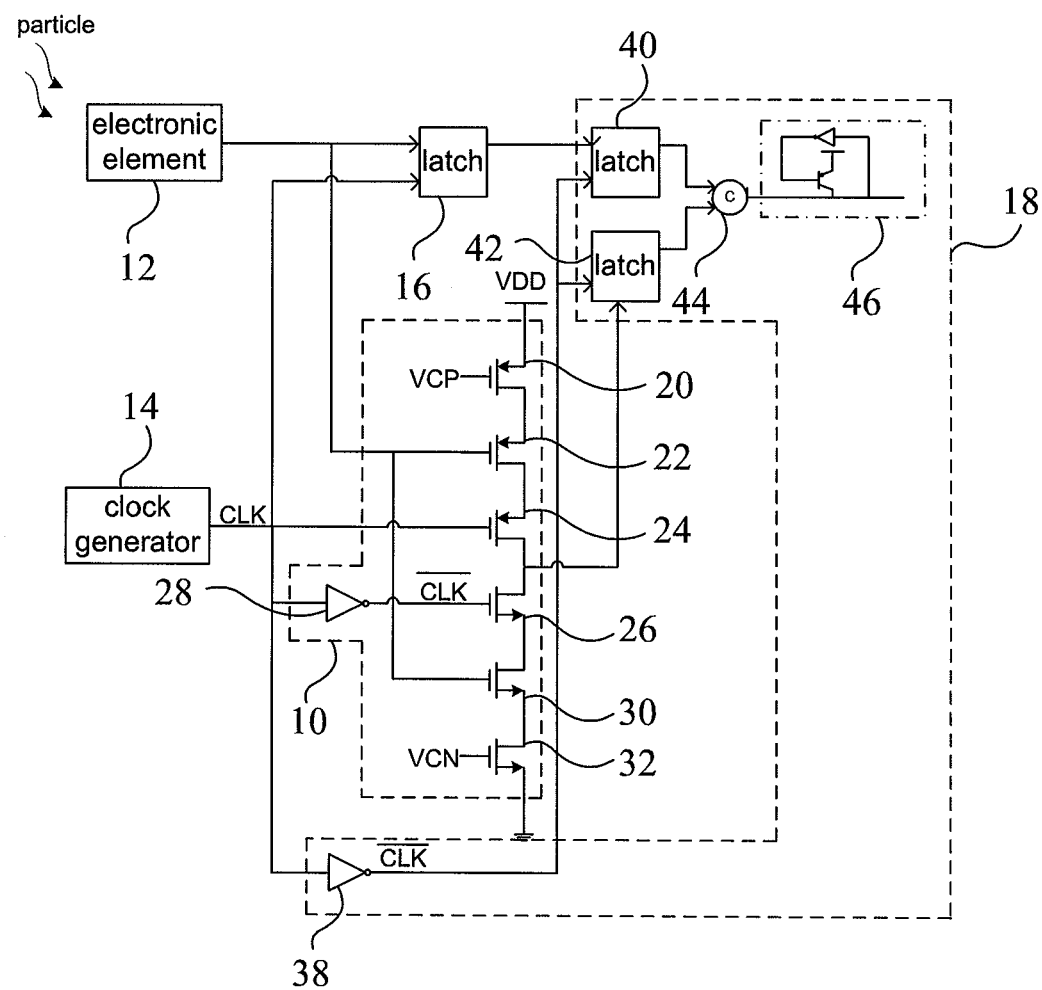
FIG. 1 is a schematic diagram illustrating a soft error protection device according to an embodiment of the present invention.

Refer to FIG. 1. A soft error protection device of the present invention is also called a Soft Error Resilient Latch-date flip flop (SERL-DFF), which comprises a soft error resilient latch (SERL) 10 coupled to an electronic element 12 and a clock (CLK) generator 14, receiving a soft error pulse and a clock (CLK) signal respectively outputted by the electronic element 12 and the CLK generator 14, and delaying the soft error pulse. The SERL 10 stores the delayed soft error pulse corresponding to a negative level of the clock signal and used as a first detection data in the period of the negative level. A first latch 16 is coupled to the electronic element 12 and the clock generator 14 to receive the soft error pulse and the clock signal. The first latch 16 stores the soft error pulse used as a second detection data and corresponding to the negative level in the period of the negative level. A detection device 18 is coupled to the SERL 10, the first latch 16 and the clock generator 14 to receive the clock signal, the first and second detection datum, and compares the first and second detection datum to send out a detection signal when the clock signal rises from the negative level to a positive level. For example, the first and second detection datum are unequal when the clock signal rises from the negative level to the positive level, and the detection signal retains an original value thereof, and the detection signal is a high-level signal or a low-level signal. Alternatively, the first and second detection datum are equal when the clock signal rises from the negative level to the positive level, and the detection signal and the compared second detection data are unequal, and the detection signal is a high-level signal or a low-level signal.

Figure 2:
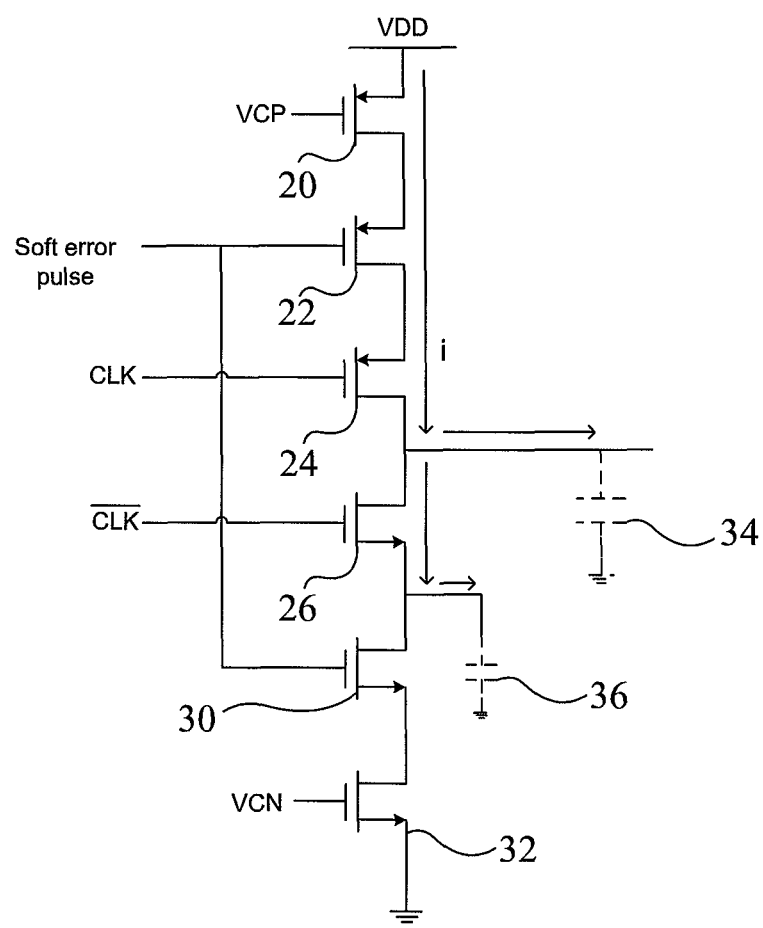
FIG. 2 is a schematic diagram illustrating operation of a soft error resilient latch (SERL) according to an embodiment of the present invention.

Refer to FIG. 1 and FIG. 2. The SERL 10 further comprises a first electronic switch 20 coupled to a high-voltage terminal VDD and receiving a low-level signal VCP to be turned on. The first electronic switch 20 and the electronic element 12 are coupled to a second electronic switch 22 receiving the soft error pulse. The second electronic switch 22, the clock generator 14 and the detection device 18 are coupled to a third electronic switch 24 receiving the clock signal, and the third electronic switch 24 is turned on in the period of the negative level of the clock signal. A fourth electronic switch 26 is coupled to the third electronic switch 24 and coupled to the clock generator 14 through a first inverter 28 to receive the reversed clock signal, and the fourth electronic switch 26 is turned on in the period of the negative level of the clock signal. A fifth electronic switch 30 is coupled to the fourth electronic switch 26 and the electronic element 12 to receive the soft error pulse. The fifth electronic switch 30 and a grounding terminal used as a low-voltage terminal are coupled to a sixth electronic switch 32 receiving a high-level signal VCN to be turned on. The high-level signal VCN and the low-level signal VCP gradually respectively descends and rises in the period of the negative level of the clock signal whereby the sixth electronic switch 32 and the first electronic switch 20 delay the time that the soft error pulse is stored in output parasitic capacitances 34 and 36 of the third and fourth electronic switches 24 and 26 through the second and third electronic switches 22 and 24. In the embodiment, the first, second, and third electronic switches 20, 22, and 24 are exemplified by P-channel field effect transistors (PMOSFETs), and the fourth, fifth, and sixth electronic switches 26, 30, and 32 are exemplified by N-channel field effect transistors (NMOSFETs). The output parasitic capacitances 34 and 36 make a pulse require more effort to flip the logic value on the output of SERL 10 since the tiny pulse cannot charge or discharge in time. Therefore, the SERL 10 masks more tiny pulses than BISER because of the capacity effect.

The detection device 18 further comprises a second inverter 38 coupled to the clock generator 14 to receive the clock signal and reverse it. The second inverter 38 and the first latch 16 are coupled to a second latch 40 receiving the second detection data and the reversed clock signal. The second latch 38 stores the second detection data corresponding to the positive level in the period of the positive level of the clock signal. The second inverter 38 and the SERL 10 are coupled to a third latch 42 receiving the first detection data and the reversed clock signal. The third latch 42 stores the first detection data corresponding to the positive level in the period of the positive level of the clock signal. The second and third latches 40 and 42 are coupled to a detection element 44 such as a C-element. The detection element 44 receives and compares the first and second detection datum corresponding to the positive level in the period of the positive level, so as to send out the detection signal. Besides, a voltage stabilizer 46 is coupled to the detection element 44 to stabilize the detection signal.

Figure 3:
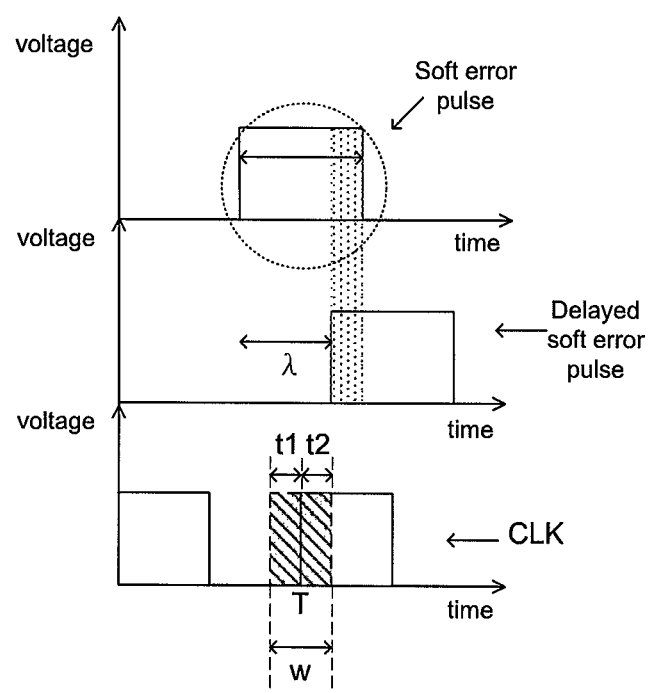
FIG. 3 is a waveforms diagram illustrating a soft error pulse and a clock signal according to an embodiment of the present invention.

Refer to FIG. 1, FIG. 2 and FIG. 3. When a particle strikes on the electric element 12, the electric element 12 transmits the soft error pulse to the first latch 16, the second electric switch 22 and the fifth electric switch 30. Meanwhile, the clock generator 14 sends out the clock signal. The clock signal is transmitted to the first inverter 28, the second inverter 38, the third electric switch 24 and the first switch 16. The first inverter 28 and the second inverter 38 reverses the clock signal to send out it. The fourth electric switch 26 receives the reversed clock signal from the first inverter 28, and the first electric switch 20 and the sixth electric switch 32 respectively receive the low-level signal VCP and the high-level signal VCN to be turned on. In the period of the negative level of the clock signal, the high-level signal VCN and the low-level signal VCP gradually respectively descends and rises whereby the sixth electronic switch 32 and the first electronic switch 20 delay the time that the soft error pulse is stored in the output parasitic capacitances 34 and 36 of the third and fourth electronic switches 24 and 26 through the second and third electronic switches 22 and 24. And, the delayed soft error pulse is used as a first detection data, namely a low-level signal. In the period of the negative level of the clock signal, the first latch 16 stores the soft error pulse corresponding to the negative level and used as a second detection data, namely a high-level signal.

The second latch 40 and the third latch 42 receive the reversed clock signal from the second inverter 38, and the second latch 40 and the third latch 42 respectively receive the second detection data and the first detection data. At the time point T that the clock signal rises from the negative level to the positive level, the second latch 40 and the third latch 42 respectively store the second detection data and the first detection data corresponding to the time point T, wherein the stored second detection data and first detection data are respectively a high-level signal and a low-level signal. Meanwhile, the detection element 44 receives and compares the first and second detection datum to send out the detection signal which is stabilized by the voltage stabilizer 46. In the embodiment, the detection signal retains the original value thereof which denotes interference from the soft error. The detection signal does not retain the original value thereof which denotes no interference from the soft error. In order to successfully obtain data at time point T, the second latch 40 and the third latch 42 have to begin to store the data at time point T−t1 until time point T+t2. The difference between the time points T−t1 and T+t2 has to be less than and positioned within the width of the soft error.

Figure 4:
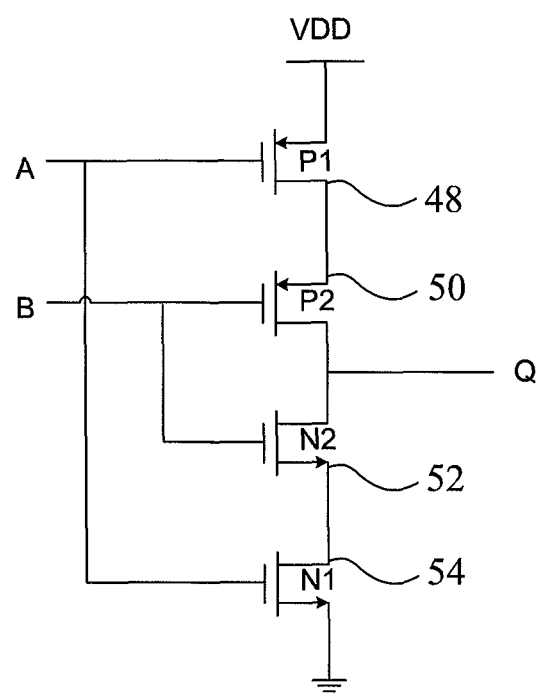
FIG. 4 is a schematic diagram illustrating a C-element according to an embodiment of the present invention.

The detection element 44 of the present invention is realized with a C-element which is shown in FIG. 4. The detection element 44 comprises a first P-channel field effect transistor (PMOSFET) 48, a second PMOSFET 50, a first NMOSFET 52 and a second NMOSFET 54. The PMOSFET 48 and the second NMOSFET 54 receive a signal A, and the second PMOSFET 50 and the first NMOSFET 52 receive a signal B. Thus, the second PMOSFET 50 and the first NMOSFET 52 output a signal Q. When A and B are both low-level signals, Q is high-level signal. When A and B are both high-level signals, Q is low-level signal. When A and B are respectively a low-level signal and a high-level signal, Q retains the original value, namely an output value from the previous cycle. When A and B are respectively a high-level signal and a low-level signal, Q retains the original value, namely an output value from the previous cycle.

For different neutron strikes caused by cosmic rays, every deposited charge Q has different striking rate. Where F, K, A, Qs and Q respectively present neutron flux with energy, technology-independent fitting parameter, susceptible area, charge-collection slope and deposited electric quantity. The equation is used to evaluating The probability of every deposited charge Q is expressed by $$R(Q) = FKA\frac{1}{Q_s}\exp\left(\frac{-Q}{Q_s}\right).$$

Consider Q=20 fC, 50 fC, 80 fC and 120 fC in our simulation with 1 ns clock period. At each clock period, divide the clock cycle into 1000 slices. In each slice, use R(Q) to evaluate the soft error rate. Compared with BISER, SERL-DFF results in lower soft error rates as listed in Table 1. Particularly, the soft error rate becomes zero as when the delay times are 93 ps and 109 ps, because they are larger than the transient pulse width.

TABLE 1

| | delay | | | | | |
|---|---|---|---|---|---|---|
| | 58 ps | 64 ps | 71 ps | 81 ps | 93 ps | 109 ps |
| BISER | $2.56\,e^{-2}$ | $2.17\,e^{-2}$ | $1.83\,e^{-2}$ | $1.22\,e^{-2}$ | $7.11\,e^{-2}$ | $2.53\,e^{-3}$ |
| SERL-DFF | $6.08\,e^{-3}$ | $5.19\,e^{-4}$ | $1.08\,e^{-4}$ | $6.45\,e^{-7}$ | 0.0 | 0.0 |

In addition, since a SERL-DFF has fewer transistors than a BISER as listed in Table 2, its area is smaller than that of a the BISER.

TABLE 2

|  | Number of Transistor |
| --- | --- |
| BISER | 49 |
| SERL DFF | 45 |

In conclusion, the present invention not only has a smaller area but also effectively reduces the probabilities of occurrence of soft error.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A soft error protection device comprising:
a soft error resilient latch (SERL) coupled to an electronic element and a clock (CLK) generator, receiving a soft error pulse and a clock (CLK) signal respectively outputted by said electronic element and said CLK generator, and delaying said soft error pulse, and said SERL stores delayed said soft error pulse corresponding to said negative level of said clock signal in a period of said negative level, and said delayed said soft error pulse stored by said SERL is used as a first detection data;
a first latch coupled to said electronic element and said clock generator to receive said soft error pulse and said clock signal, and said first latch stores said soft error pulse corresponding to said negative level in said period of said negative level, and said soft error pulse stored by said first latch is used as a second detection data; and
a detection device coupled to said SERL, said first latch and said clock generator to receive said clock signal, said first and second detection datum, and comparing said first and second detection datum to send out a detection signal when said clock signal rises from said negative level to a positive level, and said SERL further comprises:
a first electronic switch coupled to a high-voltage terminal and receiving a low-level signal to be turned on;
a second electronic switch coupled to said first electronic switch and said electronic element and receiving said soft error pulse;
a third electronic switch coupled to said second electronic switch, said clock generator and said detection device to receive said clock signal, and said third electronic switch is turned on in said period of said negative level;
a fourth electronic switch coupled to said third electronic switch and coupled to said clock generator through a first inverter to receive reversed said clock signal, and said fourth electronic switch is turned on in said period of said negative level;
a fifth electronic switch coupled to said fourth electronic switch and said electronic element to receive said soft error pulse; and
a sixth electronic switch coupled to said fifth electronic switch and a low-voltage terminal and receiving a high-level signal to be turned on, and said high-level signal and said low-level signal gradually respectively descends and rises in said period of said negative level whereby said sixth electronic switch and said first electronic switch delay time that said soft error pulse is stored in output parasitic capacitances of said third and fourth electronic switches through said second and third electronic switches.

2. The soft error protection device of claim 1, wherein said first and second detection datum are unequal in a period of said positive level, and said detection signal retains an original value thereof, and said detection signal is a high-level signal or a low-level signal.

3. The soft error protection device of claim 1, wherein said first and second detection datum are equal in a period of said positive level, and said detection signal and said second detection data corresponding to said positive level are unequal, and said detection signal is a high-level signal or a low-level signal.

4. The soft error protection device of claim 1, wherein said first, second, and third electronic switches are P-channel field effect transistors (PMOSFETs), and said fourth, fifth, and sixth electronic switches are N-channel field effect transistors (NMOSFETs).

5. The soft error protection device of claim 1, wherein said low-voltage terminal is a grounding terminal.

6. The soft error protection device of claim 1, said detection device further comprises:
a second inverter coupled to said clock generator to receive said clock signal and reverse it;
a second latch coupled to said second inverter and said first latch to receive said second detection data and reversed said clock signal, and said second latch stores said second detection data corresponding to said positive level in a period of said positive level;
a third latch coupled to said second inverter and said SERL to receive said first detection data and said reversed said clock signal, and said third latch stores said first detection data corresponding to said positive level in said period of said positive level; and
a detection element coupled to said second and third latches, and said detection element receives and compares said first and second detection datum corresponding to said positive level in said period of said positive level, so as to send out said detection signal.

7. The soft error protection device of claim 6, further comprises a voltage stabilizer coupled to said detection element to stabilize said detection signal.

8. The soft error protection device of claim 6, wherein said detection element is a C-element.

* * * * *